(12) United States Patent  (10) Patent No.: US 8,729,653 B2
Gallagher et al.  (45) Date of Patent: May 20, 2014

(54) INTEGRATED DIE-LEVEL CAMERAS AND METHODS OF MANUFACTURING THE SAME

(75) Inventors: Dennis Gallagher, Boulder, CO (US); Adam Greengard, Superior, CO (US); Paulo E. X. Silveira, Boulder, CO (US); Chris Linnen, Erie, CO (US); Vladislav Chumachenko, Louisville, CO (US); Jungwon Aldinger, Loveland, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 118 days.

(21) Appl. No.: 13/281,674

(22) Filed: Oct. 26, 2011

(65) Prior Publication Data

US 2013/0105925 A1 May 2, 2013

(51) Int. Cl.
*H01L 31/0232* (2006.01)

(52) U.S. Cl.
USPC ............................................. 257/432; 348/302

(58) Field of Classification Search
USPC ............................................. 257/432; 348/302
See application file for complete search history.

(56) References Cited

U.S. PATENT DOCUMENTS

| 5,130,794 A | 7/1992 | Ritchey |
| 5,172,236 A | 12/1992 | Takemoto et al. |
| 5,282,045 A | 1/1994 | Mimura et al. |
| 5,771,416 A | 6/1998 | Mukai et al. |
| 5,814,803 A | 9/1998 | Olmstead et al. |
| 6,128,416 A | 10/2000 | Oura |
| 6,201,899 B1 | 3/2001 | Bergen |
| 6,654,013 B1 | 11/2003 | Malzbender et al. |
| 6,856,708 B1 | 2/2005 | Aoki |
| 7,274,830 B2 | 9/2007 | Bacarella et al. |
| 2001/0045982 A1 | 11/2001 | Okisu et al. |
| 2002/0140823 A1 | 10/2002 | Sakurai et al. |
| 2002/0162944 A1 | 11/2002 | Huang et al. |
| 2003/0026588 A1 | 2/2003 | Elder et al. |
| 2003/0169944 A1 | 9/2003 | Dowski et al. |
| 2003/0234867 A1 | 12/2003 | Fujita et al. |
| 2004/0003689 A1 | 1/2004 | Bryan |
| 2004/0047518 A1 | 3/2004 | Tiana |
| 2004/0080661 A1 | 4/2004 | Afsenius |
| 2004/0105569 A1 | 6/2004 | Sharma et al. |
| 2004/0228005 A1 | 11/2004 | Dowski et al. |
| 2004/0234154 A1 | 11/2004 | Hier |

(Continued)

FOREIGN PATENT DOCUMENTS

| CN | 1494701 | 5/2004 |
| CN | 1959468 | 5/2007 |

(Continued)

OTHER PUBLICATIONS

Office Action issued in European Patent Application 08797119.8, dated Mar. 27, 2013, 6 pages.

(Continued)

*Primary Examiner* — Douglas Menz
(74) *Attorney, Agent, or Firm* — Lathrop & Gage LLP

(57) ABSTRACT

An integrated die-level camera system and method of making the camera system include a first die-level camera formed at least partially in a die. A second die level camera is also formed at least partially in the die. Baffling is formed to block stray light between the first and second die-level cameras.

9 Claims, 9 Drawing Sheets

(56) References Cited

U.S. PATENT DOCUMENTS

| | | |
|---|---|---|
| 2005/0018962 A1 | 1/2005 | Cho et al. |
| 2005/0248590 A1 | 11/2005 | Tian et al. |
| 2006/0050338 A1 | 3/2006 | Hattori |
| 2006/0061678 A1 | 3/2006 | Yamazaki |
| 2006/0269150 A1 | 11/2006 | Lee |
| 2007/0188601 A1 | 8/2007 | Rohaly et al. |
| 2007/0247517 A1 | 10/2007 | Zhang et al. |
| 2008/0056612 A1 | 3/2008 | Park et al. |
| 2008/0218613 A1 | 9/2008 | Janson et al. |
| 2011/0019048 A1* | 1/2011 | Raynor et al. ........ 348/302 |

FOREIGN PATENT DOCUMENTS

| | | |
|---|---|---|
| EP | 1420453 A | 5/2004 |
| EP | 1726984 A | 11/2006 |
| JP | 60060757 A | 4/1985 |
| JP | 2005292544 A | 9/1998 |
| JP | 2006184844 A | 7/2006 |
| WO | 2004027880 A | 4/2004 |
| WO | 2008020899 A2 | 2/2008 |
| WO | 2009020918 A1 | 2/2009 |
| WO | 2009097552 A1 | 8/2009 |

OTHER PUBLICATIONS

Office Action issued in related Chinese Patent Application 200880110346.X, dated Mar. 29, 2012, 6 pages.
Office Action issued in related European Patent Application 08797119.8, dated Jun. 13, 2012, 4 pages.
Office Action issued in related Chinese Patent Application 200880110346.X, dated Sep. 28, 2012.
Response to Office Action filed in related Chinese Patent Application 200880110346.X, filed Dec. 6, 2012, 5 pages.
Response to Office Action issued in related European Patent Application 08797119.8, filed Oct. 31, 2012, 17 pages.
International Search Report and Written Opinion cited in PCT/US2007/009347 dated Jul. 22, 2008, 9 pages.
International Search Report and Written Opinion cited in PCT/US2008/072112 dated Nov. 10, 2008, 13 pages.
Kuiper, S, et al., "Variable-Focus Liquid Lens for Miniature Cameras," Applied Physics Letters, AIP American Institute of Physics, Melville, NY, US, vol. 85, No. 7, pp. 1128-1130, Aug. 16, 2004.
Translation of Office Action issued in Chinese Patent Application 200880110346.X dated Sep. 7, 2011, 4 pages.
Translation of Response to Office Action issued in Chinese Patent Application 200880110346.X filed Jan. 18, 2012, 5 pages.
Hong, Sahyun, et al. "Data Fusion of Multiple Polarimetriv SAR Images Using Discrete Wavelet Transform (DWT)" IEEE, 3323-3325, 2002.
Office Action issued in related Taiwanese Patent Application 098103287 dated Jan. 9, 2013, 29 pages.
Kiyoharu, et al, "Producing Object-Based Special Effects by Fusing Multiple Differently focused Images," IEEE Transactions on Circuits an dSystem for video Technology, IEEE Service Center, vol. 10, No. 2, Mar. 1, 2000.
Kazuya Kodama, et al., "All-In-Focus Image Generation by Merging Mulitple Differently Focused Images in Three-Dimensional Frequency Domain," Advances in Multimedia Information Processing-PCT 2005 Lecture Notes in Computer Science, vol. 3767, pp. 303-314, Jan. 1, 2005.
Snavely, et al., "Photo Tourism: Exploring Photo Collections in 3D," ACM Transactions on Graphics, 25(3) Aug. 2006.
Bao and Xu, "Complex Wavelet-Based Image Mosaics Using Edge-Preserving Visual Perception Modeling," Computers and Graphics 23.3 (1999); 309-321.
Brown and Lowe, "Recognising Panoramas," Proceedings of the Ninth IEE International Conference on Computer Vision, vol. 2, No. 1218-1225, 2003.
Klarquist and Bovik, "Fovea: A foveated Vergent Active Stereo Vision System for Dynamic Three-Dimensional Scene Recovery," Robotics and Automation, IEEE Transactions on 14.5 (1998): 755-770.
Kuhnlenz, et al., "A Multi-Focal High-Performance Vision System," Robotics and Automation, 2006, ICRA 2006, Proceedings 2006, IEE International Conference, IEEE, 2006.
Scassellati, "A binocular, Foveated Active Vision System," No. AL-M-1628, Massachusetts Inst. of Tech Cambridge Artificial Intelligence Lab, 1999.
Zhao, et al., "Broadband and Wide Field of View Foveated Imaging System in Space," Optical Engineering 47.110 (2008): 103202-103202.
Wikipedia, http://en.wikipedia.org/wiki/Image_scaling, Jan. 29, 2007.
Office Action issued in Chinese Application 200880110346X dated Feb. 25, 2013 13 pages.
Office Action issued in U.S. Appl. No. 12/865,343 dated Mar. 6, 2013, 43 pages.
Drori, Iddo, and Dani Lischinski "Fast Multiresolution Image Operations in the Wavelet Domain," Visulization and Computer Graphics, IEE Transactions on 9.3 (2003): 935-441.
U.S. Appl. No. 12/865,343 Office Action dated Aug. 28, 2013, 40 pages.
U.S. Appl. No. 12/865,343 Response dated Oct. 31, 2013, 21 pages.
U.S. Appl. No. 12/865,343 Advisory Action dated Nov. 13, 2013, 3 pages.
U.S. Appl. No. 12/865,343 Response dated Nov. 27, 2013, 25 pages.

* cited by examiner

INTEGRATED DIE-LEVEL CAMERAS AND METHODS OF MANUFACTURING THE SAME

BACKGROUND

1. Field of the Invention

The disclosure relates to integrated die-level cameras and methods of making the same and, more particularly, to devices, systems and methods in which multiple cameras are integrated in the same die, which is cut or otherwise removed from a wafer.

2. Description of the Related Art

Electronic devices, such as mobile telephones, smart phones, personal digital assistants (PDAs), etc., increasingly include more than one camera. In general, the multiple cameras have different configurations and performance characteristics. As devices have become increasingly sophisticated, the level of functional specialization of each camera has increased. For example, typical applications may require one main camera with higher resolution, image quality and dimensions and at least one additional camera with lesser requirements, e.g., lower resolution, cost, dimensions, image quality, etc. Some particular devices may include more than two cameras, each having specialized requirements. Some of these cameras may not be used for image capture, but are instead included to carry out such functions as, for example, determining whether a face is present in its field of view, detecting light level, recognizing gestures, etc.

In conventional systems having multiple cameras, multiple individual cameras are designed, developed and produced, each camera being customized for a specific function. This conventional approach has the disadvantage that multiple process steps are required for each camera, resulting in a higher-cost solution. Also, in some systems, the issue of preventing stray light from one imaging system from affecting the image quality of the other is not addressed. This issue can have a substantial negative effect on the performance of one or more of the cameras and the overall system.

SUMMARY

According to one aspect, the disclosure is directed to an integrated die-level camera system. The die-level camera system includes a first die-level camera formed at least partially in a die, and a second die-level camera formed at least partially in the die. The die-level camera system also includes baffling for blocking stray light between the first and second die-level cameras.

According to another aspect, the disclosure is directed to a mobile imaging device, which includes a plurality of die-level cameras formed in a common die. At least one of the cameras has a first set of performance characteristics, and at least a second one of the cameras has a second set of performance characteristics that is different from the first set of performance characteristics. Baffling blocks stray light between the die-level cameras.

According to another aspect, the disclosure is directed to a method of fabricating a die-level camera system. According to the method, a first die-level camera is formed at least partially in a die. A second die-level camera is also formed at least partially in the die. Stray light is blocked between the first and second die-level cameras.

According to another aspect, the disclosure is directed to a method of fabricating a mobile imaging device. According to the method, a plurality of die-level cameras is formed in a common die. At least one of the cameras has a first set of performance characteristics, and at least a second one of the cameras has a second set of performance characteristics that is different from the first set of performance characteristics. Stray light is blocked between the die-level cameras.

According to the disclosure, multiple cameras are integrated into a single device, module or system in such a way that the integrated solution of the present disclosure is substantially less costly than producing multiple individual cameras, due to the substantial reduction in fabrication process steps. Furthermore, the disclosure provides this solution while also solving the problem of stray light from one camera affecting the performance of another camera.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions may be exaggerated for clarity.

DETAILED DESCRIPTION

According to some exemplary embodiments, multiple cameras are integrated into a single integrated camera device, system or module. In some particular exemplary embodiments, the camera device, system or module of the disclosure is used in a mobile device, such that the mobile device includes multiple, e.g., two, cameras. It should be noted that the disclosure is applicable to any number of die-level cameras integrated into a die, notwithstanding the fact that the present detailed description refers to some exemplary embodiments in which two cameras are formed. This is merely for clarity and ease of description.

In some embodiments, the first camera (Cam1) is to be used for the capture of high-definition (HD) images and video, while the second camera (Cam2) is a comparatively simple low-resolution camera, e.g., 140×160 pixels, used for task-based applications. Such task-based applications include, but are not limited to, for example, detecting the light level, detecting the presence of a face, detecting hand gestures, etc. Cam2 requires a simpler design, a smaller sensor and has lower modulation transfer function (MTF) requirements, while Cam1 requires a large sensor with, in some exemplary embodiments, a 16:9 aspect ratio, and has more stringent MTF requirements.

A HD camera such as Cam1 typically requires a large sensor with a 16:9 aspect ratio, high resolution and high MTF. In particular, the highly asymmetric aspect ratio of such a sensor poses a problem for wafer-level optics (WLO). In WLO, the integrated die-level camera device, module or system of the disclosure, which includes multiple integrated die-level cameras, is typically formed in a wafer or substrate or stack of wafers or substrates along with multiple other integrated die-level camera devices, modules or systems. The die-level cameras are built in a manner similar to semiconductor manufacturing, often starting with a semiconductor wafer with image sensors already fabricated therein. Additional processing may utilize templates or fabrication masters (simply called "masters" herein, with their use called "mastering") and/or additional wafers or lens plates aligned to the semiconductor wafer, to add lenses and other elements atop the image sensors. At some point during the fabrication process, the individual dies in the wafer or stack of wafers are separated from each other by some process such as, for example, sawing, laser cutting, etc., or other such process. The result of separating the dies is the die-level camera device, module or system of the present disclosure, which includes multiple die-level cameras. Like integrated circuits, the cost of a finished unit depends strongly on die size; smaller die sizes provide more finished units per wafer.

Figure 1:
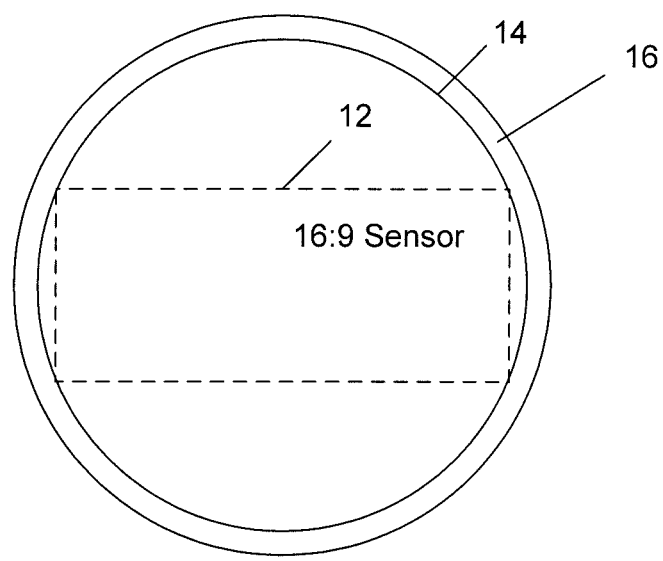
FIG. 1 is a schematic diagram depicting the layout of a 16:9 high definition (HD) sensor in a wafer or die.
Figure 1A:
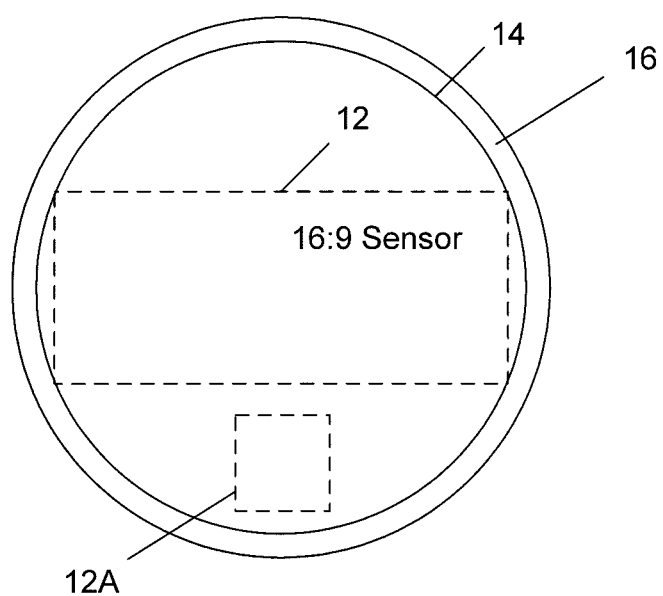
FIG. 1A is a schematic diagram depicting a second sensor next to the layout of the 16:9 high definition (HD) sensor of FIG. 1, in a wafer or die.

The usual WLO method for fabricating such a lens involves populating a wafer with circular lenses that have a diameter at least as large as the image diagonal, as shown in FIG. 1, which is a schematic diagram depicting the layout of 16:9 HD camera lens in a wafer or die. In an embodiment, the lens may be a combination of lenses, each lens element being formed in an individual wafer (see FIG. 4). When formed in this way, a wafer of lenses may be molded such that the optical area of each lens adjoins molded material that holds the lens in place but through which light does not pass in the finished camera; the molded material that is structurally attached but is not used optically is referred to herein as a "lens yard." Referring to FIG. 1, the circular lens 14, surrounded by lens yard 16, has a diameter at least as large as the diagonal of the 16:9 sensor 12. In such geometry, the 16:9 aspect ratio results in sparsely populated wafers, resulting in a reduced total number of dies per wafer, i.e., a wafer with a low fill factor, and, consequently, a relatively high cost per camera. According to the disclosure, the fill factor of the wafer may be improved by forming a second sensor 12A of Cam2 as shown in FIG. 1A.

Figure 2:
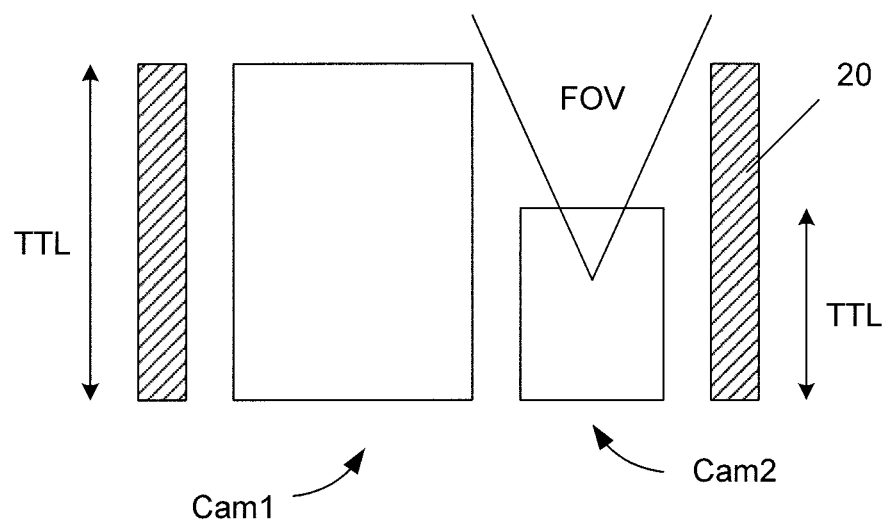
FIG. 2 is a schematic diagram of a device for multiple cameras, in which two cameras are simultaneously disposed.

Another challenge in forming multiple individual cameras in the same device involves the relative sizes of the cameras. For example, in the module defined above in which one HD camera (Cam1) is to be formed with a relatively smaller camera (Cam2), the difference in size of the two cameras presents some difficulties. FIG. 2 is a schematic diagram of a frame of a device for multiple cameras, in which Cam1 and Cam2 are simultaneously disposed. Referring to FIG. 2, Cam1 and Cam 2 are located side-by-side adjacent to one another within a device frame 20. As indicated by the exemplary dimensions entered in FIG. 2, Cam2 is very small and, therefore, difficult to manufacture and to dice and handle. Also, when placed next to Cam1 as shown in FIG. 2, the two cameras have different total track length (TTL), which results in obscuration of the image of Cam2. That is, because of the difference in TTL of the two cameras, the field of view (FOV) of Cam2 is blocked when placed next to Cam1.

According to the disclosure, a solution to the problems described above is to integrate both cameras into a single module. This can be accomplished by sharing the same lens plates and masters between both cameras. Also, both sensors can be formed in the same wafer, which results in a significant cost advantage. This results in a more efficient utilization of the empty spaces between Cam1 elements and solves the handling issues associated with Cam2. This approach also allows both cameras to share the costs and schedule associated with developing and mastering a WLO camera.

Figure 3:
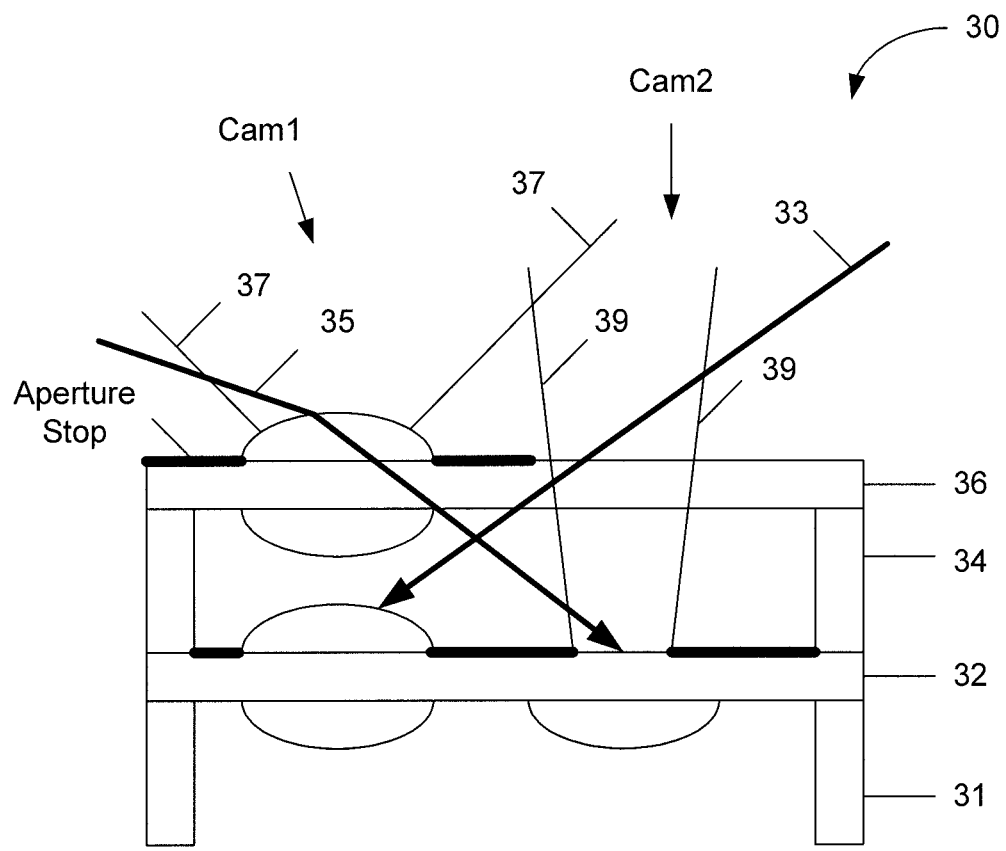
FIG. 3 contains a schematic diagram of two cameras integrated in a single module.

FIG. 3 contains a schematic diagram of two cameras, e.g., Cam1 and Cam2 described above, integrated in a single module. The module 30 can include multiple layers (e.g., wherein each layer is formed by lenses fabricated in wafer form) 31, 32, 34, 36 stacked on top of each other as shown. The cameras Cam1 and Cam 2 are integrated in the layers or wafers 31, 32, 34, 36 as illustrated schematically in FIG. 3. Each of cameras Cam1 and Cam2 has its own FOV, indicated by lines in the drawing of FIG. 3. Specifically, the FOV of Cam1 is illustrated by lines 37, and the FOV of Cam2 is illustrated by lines 39. A possible drawback of integrating multiple cameras as shown in FIG. 3 is that the aperture of one of the cameras can be a source of stray light in the other camera. That is, when two or more cameras are integrated as shown in FIG. 3, each becomes vulnerable to stray light incident through the clear aperture from the other camera, in particular, to stray light incident beyond the FOV of the other camera. Specifically, referring to FIG. 3, out-of-field light leakage or stray light is indicated by lines 33 and 35. Line 33 indicates out-of-field light leakage, i.e., stray light, out of the FOV of Cam2 impinging on Cam1 and, therefore, affecting the image generated by Cam1. Similarly, line 35 indicates out-of-field light leakage, i.e., stray light, out of the FOV of Cam1 impinging on Cam2.

Figure 4:
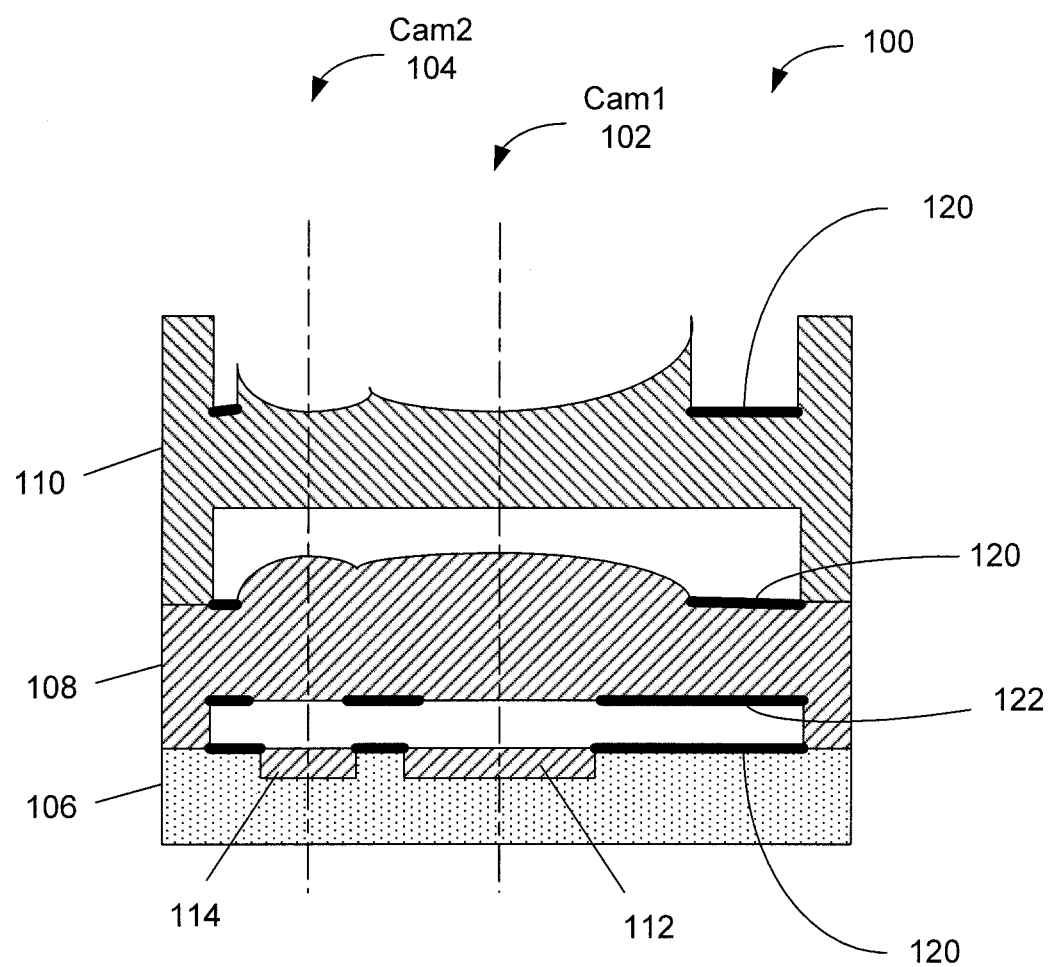
FIG. 4 contains a schematic cross-sectional view of an integrated camera structure having multiple cameras, according to exemplary embodiments.

FIG. 4 contains a schematic cross-sectional view of an integrated camera system 100 having multiple cameras, e.g., Cam1 and Cam2, which includes a solution to the stray light problem, according to an exemplary embodiment. FIG. 4 is a schematic cross-sectional view taken along line A-A of FIG. 5. Referring to FIG. 4, camera system 100 includes two cameras, referred to herein as Cam1 102 and Cam2 104, which are formed in three layers or wafers. The die includes three layers or wafers, which include a lower layer 106, a middle layer 108 and an upper layer 110. The sensor 112 for Cam1 102, which in one exemplary embodiment is the 16:9 aspect ratio HD sensor described above, and the sensor 114 for Cam2 104 are formed on the lower layer 106. Also, both cameras 102 and 104 share baffles 120 on the top surface of each layer 106, 108, 110. Also, both cameras 102 and 104 have aperture stops 122 at the bottom of the middle layer 108. As a result, stray light between the cameras 102 and 104 is mitigated.

Figure 5:
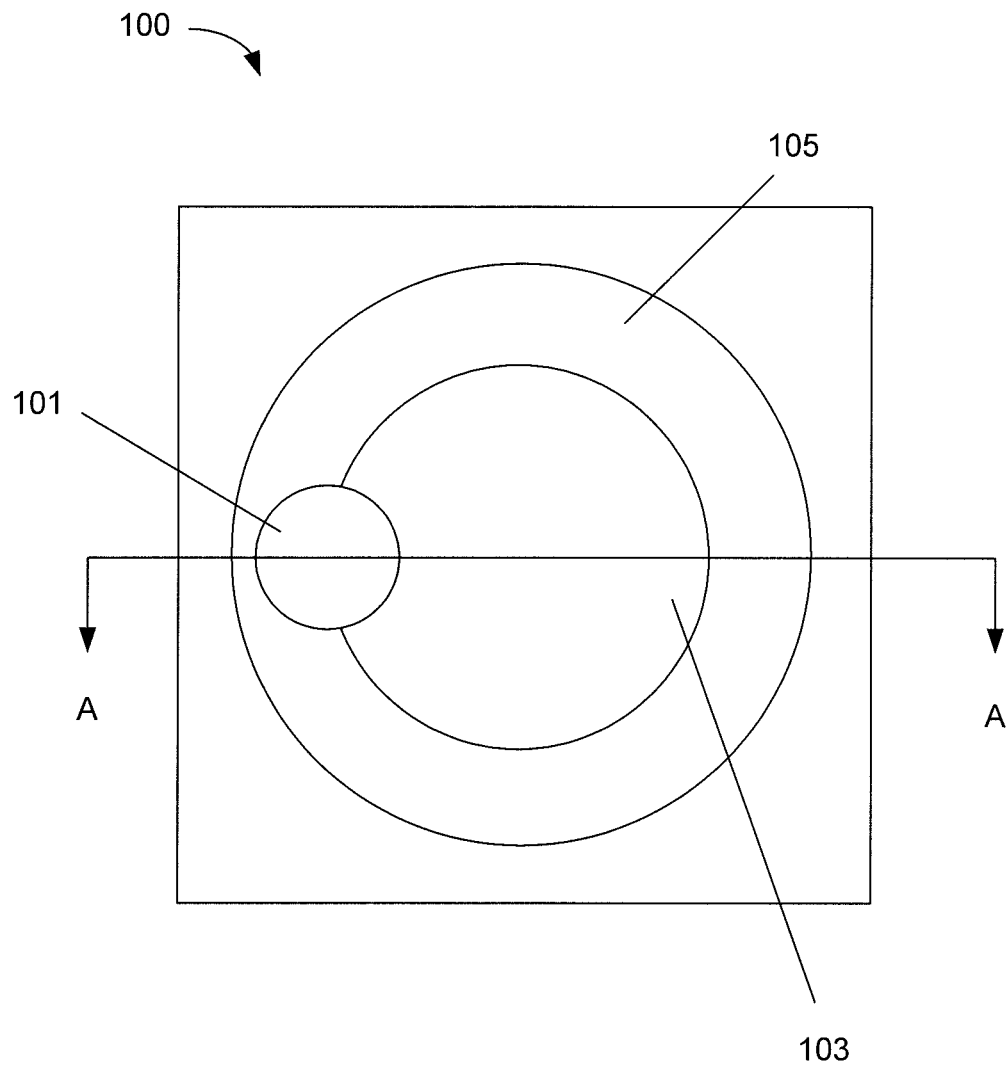
FIG. 5 contains a schematic front view of an integrated camera structure having multiple cameras, according to exemplary embodiments.

FIG. 5 is a front view of camera system 100, of which FIG. 4 shows a cross-sectional view, according to exemplary embodiments. Referring to FIG. 5, some of lens 103 in Cam1 102 is segmented to make room or provide adequate space for the Cam2 104 lens 101. This is done without significant detriment to the imaging performance of Cam1 102. That is, the segmented portions of the Cam1 102 lens 103 have a negligible effect on the image incident on the sensor of Cam1 102. According to exemplary embodiments, the lenses are formed overlapping each other, in a geometry analogous to that in bifocal glasses. According to some exemplary embodiments, a lens element of the lens 101 of Cam2 104 is configured such that it shares the same concavity as a lens element of the lens 103 of Cam1 102 in the same wafer. That is, convex and concave lenses are formed at the same plane (see FIG. 4). This is done to enable the simultaneous mastering of the integrated lenses. Also, according to some exemplary embodiments, the total track length (TTL) of Cam2 104 is extended to match that of Cam1 102. This is possible because of the relatively larger number of lens elements required by Cam1 102 as compared to that of Cam2 104. In one particular exemplary embodiment, this is accomplished by using, in Cam2 104, one or more lenses to relay the image plane to another plane within the imaging system (see FIG. 4).

According to the exemplary embodiments, the aperture stop of Cam1 102 is a baffle for Cam2 104. Similarly, the aperture stop of Cam2 104 is a baffle for Cam1 102. According to the disclosure, this provides excellent stray light mitigation between the cameras Cam1 102 and Cam2 104. Also, the aperture stop and baffle of Cam2 104 are realized at no additional cost, since, according to some exemplary embodiments, they are mastered and replicated simultaneously with the baffle and aperture stop of Cam1 102. In fact, in some exemplary embodiments, Cam1 102 and Cam2 104 are manufactured at the same time in the same steps.

According to the disclosure, the first lens 103 and the second lens 101 are formed together as shown with a shared lens yard 105. When lenses 103 and 101 are fabricated using lens replication techniques, the shared lens yard allows optical polymer to be dispensed into both lenses simultaneously, and also allows both to be replicated simultaneously, effectively providing two lenses with no additional processing steps. As also shown in FIG. 4, lenses of Cam1 and lenses of Cam2 are integrated in a single lens master, according to exemplary embodiments.

Figure 6:
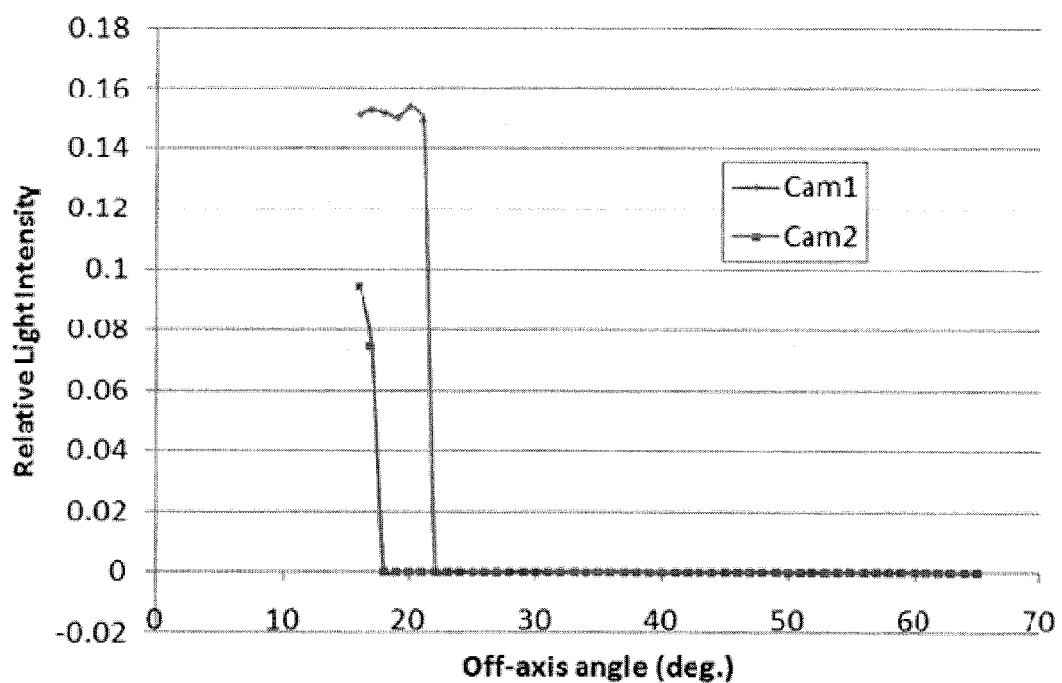
FIG. 6 contains a computer-simulated graph which illustrates the mitigation of stray light between multiple cameras, according to exemplary embodiments.

FIG. 6 contains a computer-simulated graph which illustrates the mitigation of stray light between multiple cameras, according to exemplary embodiments. Specifically, the graph of FIG. 6 shows light intensity as a function of off-axis angle. As shown in the graph of FIG. 6, in accordance with the disclosure, off-axis, i.e., stray, light is eliminated in both Cam1 102 and Cam2 104.

Figure 7:
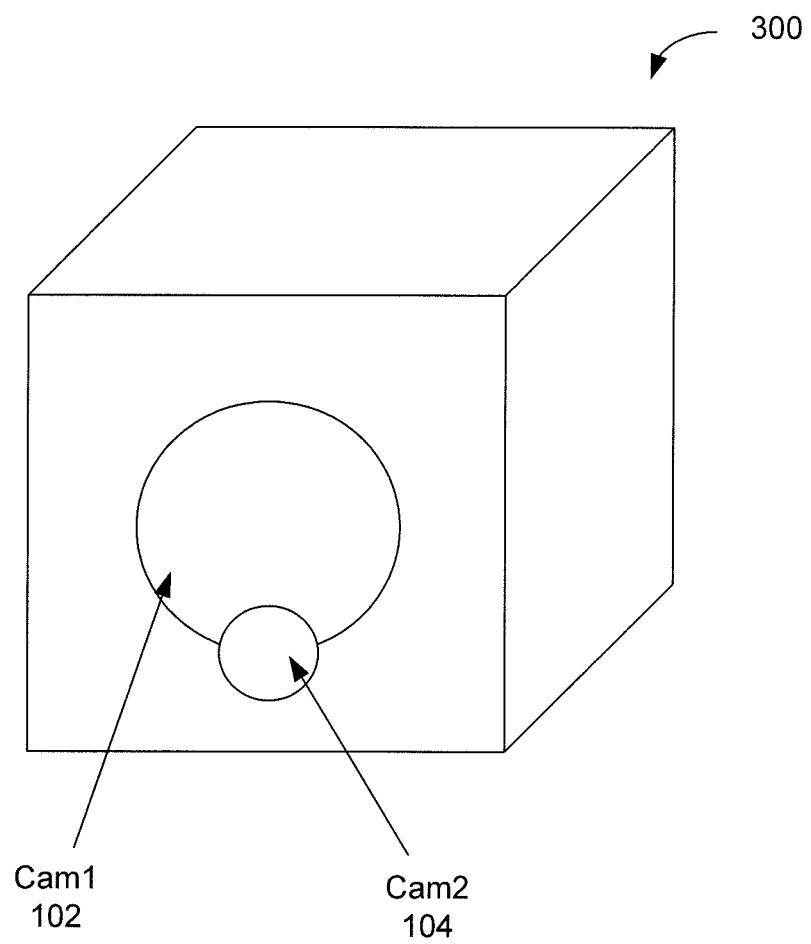
FIG. 7 contains a schematic perspective view of an exemplary embodiment of an integrated camera system.

FIG. 7 contains a schematic perspective view of an exemplary embodiment of an integrated camera system 300. Referring to FIG. 7, system 300 includes first and second cameras, e.g., Cam1 102 and Cam2 104 described in detail above, integrated in the same camera system 300. As shown in FIG. 7, system 300 includes two optical apertures in the front surface of the module. The larger aperture is for Cam1 102, and the smaller aperture is for Cam2 104. The smaller aperture for Cam2 104 overlaps with part of the clear aperture of Cam1 102. That overlapping is acceptable because it only obscures a part of the image that is not incident upon the Cam1 image sensor.

Figure 8A:
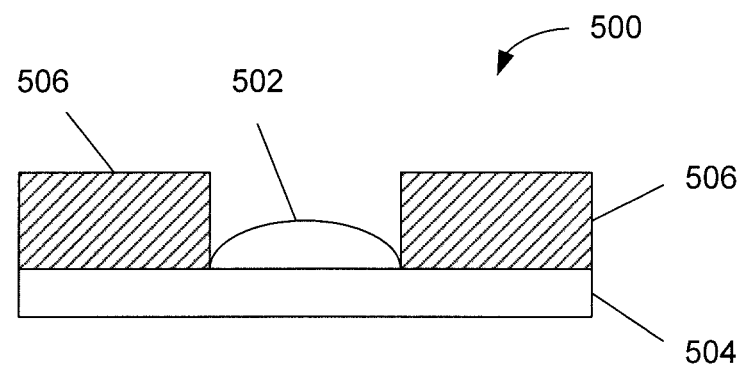
FIGS. 8A and 8B are schematic cross-sectional detailed views of two alternative approaches to addressing the issue of eliminating stray light, according to some exemplary embodiments.
Figure 8B:
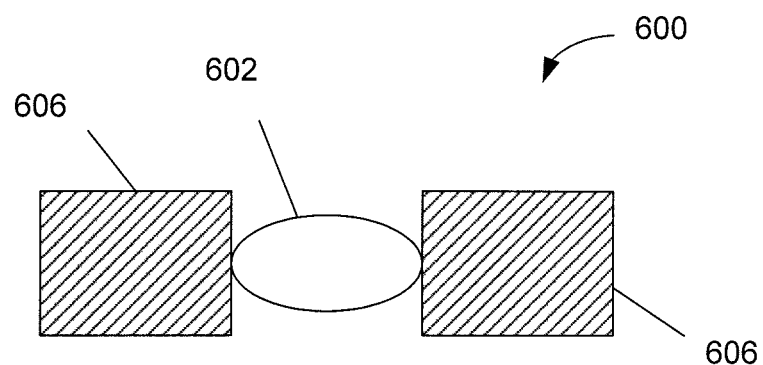

FIGS. 8A and 8B are schematic cross-sectional detailed views of two alternative approaches to addressing the issue of eliminating stray light, according to some exemplary embodiments. Referring to FIG. 8A, this configuration is referred to as a "lens in a pocket" structure 500. In this structure 500, the replicated lens 502 is formed on a substrate 504. In some exemplary embodiments, the substrate 504 can be, for example, a glass substrate. In this configuration, light blocking spacer material 506 is formed on the substrate 504 and adjacent to and at least partially surrounding the lens 502. The light-blocking material 506 blocks stray light from reaching the lens 502 and its associated integrated camera. This structure is applicable to the exemplary embodiments described herein in detail.

Referring to FIG. 8B, this configuration is referred to as a "suspended lens" structure 600, in which the lens 602 is not mounted on a substrate, but is instead suspended in and adjacent to and at least partially surrounded by light-blocking spacer material 606. The light-blocking material 606 blocks stray light from reaching the lens 602 and its associated integrated camera. This structure is applicable to the exemplary embodiments described herein in detail.

Combinations of Features

In any of the embodiments described in detail above, the first die-level camera may have first performance characteristics, and the second die-level camera may have second performance characteristics.

In any of the embodiments described in detail above, the first die-level camera may comprise a first aperture stop and the second die-level camera may comprise a second aperture stop, the first and second aperture stops forming the baffling.

In any of the embodiments described in detail above, the baffling may comprise light blocking material around one or more lenses of at least one of the first and second die-level cameras.

In any of the embodiments described in detail above, the first and second die-level cameras may be formed by a common master at the same time.

In any of the embodiments described in detail above, a larger lens of one of the first and second die-level cameras may be segmented to provide space for a lens of the other of the first and second die-level cameras.

In any of the embodiments described in detail above, lenses of the first and second die-level cameras that share a common plane may have common concavity.

In any of the embodiments described in detail above, the first and second die-level cameras may have substantially equal total track length (TTL).

In any of the embodiments described in detail above, the first performance characteristics may comprise a first resolution, and the second performance characteristics may comprise a second resolution that is less than the first resolution.

In any of the embodiments described in detail above, the first performance characteristics may comprise a first modulation transfer function (MTF) for high-resolution imaging, and the second performance characteristics may comprise a second MTF for task-based imaging. The task-based imaging may include one or more of detecting light level, detecting face presence, and detecting hand gestures.

In any of the embodiments described in detail above, lenses for the first die-level camera and lenses for the second die-level camera may be fabricated in parallel.

In any of the embodiments described in detail above, the die may be separated from a wafer or stack of wafers after the die-level cameras are formed.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

The invention claimed is:
1. An integrated die-level camera system, comprising:
a first die-level camera formed at least partially in a die;
a second die level camera formed at least partially in the die; and
baffling for blocking stray light between the first and second die-level cameras;
wherein:
the first die-level camera comprises a first plurality of lens elements and the second die-level camera comprises a second plurality of lens elements, and wherein a lens element of the first die-level camera and a lens element of the second die-level camera are formed in a wafer, and a larger lens of one of the first and second die-level cameras is segmented to provide space for a lens of the other of the first and second die-level cameras.

2. The system of claim 1, wherein a first sensor of the first die-level camera and a second sensor of the second die-level camera are formed in a wafer.

3. The system of claim 1, wherein the first die-level camera comprises a first aperture stop and the second die-level camera comprises a second aperture stop, the first and second aperture stops forming the baffling.

4. The system of claim 1, wherein lens elements of the first and second die-level cameras that share a common wafer have common concavity.

5. The system of claim 1, wherein the first and second die-level cameras have substantially equal total track length.

6. A mobile imaging device, comprising:

a plurality of die-level cameras formed in a common die, at least one of the cameras having a first set of performance characteristics and at least a second one of the cameras having a second set of performance characteristics that is different from the first set of performance characteristics; and baffling for blocking stray light between the die-level cameras;

wherein a larger lens of one of the first and second die level cameras is segmented to provide space for a lens of the other of the first and second die level cameras.

7. The device of claim 6, wherein a first one of the die-level cameras comprises a first aperture stop and a second one of the die-level cameras comprises a second aperture stop, the first and second aperture stops forming the baffling.

8. The device of claim 6, wherein the first performance characteristics comprise a first modulation transfer function (MTF) for high-resolution imaging, and the second performance characteristics comprise a second MTF for task-based imaging.

9. The device of claim 8, wherein the task-based imaging comprises one or more of detecting light level, detecting face presence, and detecting hand gestures.

* * * * *